United States Patent
Kyoung et al.

(10) Patent No.: US 12,402,335 B2
(45) Date of Patent: Aug. 26, 2025

(54) SILICON CARBIDE JUNCTION BARRIER SCHOTTKY DIODE WITH ENHANCED RUGGEDNESS

(71) Applicant: POWER CUBESEMI INC., Seongnam-si (KR)

(72) Inventors: Sin Su Kyoung, Hanam-si (KR); Tae Jin Nam, Bucheon-si (KR); Eun Ha Kim, Bucheon-si (KR); Jeong Yun Seo, Yongin-si (KR); Tai Young Kang, Gwangju-si (KR)

(73) Assignee: Powercube Semi Inc., Gyeonggi-Do (KR)

( * ) Notice: Subject to any disclaimer, the term of this patent is extended or adjusted under 35 U.S.C. 154(b) by 281 days.

(21) Appl. No.: 17/997,841

(22) PCT Filed: May 6, 2021

(86) PCT No.: PCT/KR2021/005643
§ 371 (c)(1),
(2) Date: Nov. 3, 2022

(87) PCT Pub. No.: WO2021/225372
PCT Pub. Date: Nov. 11, 2021

(65) Prior Publication Data
US 2023/0178662 A1    Jun. 8, 2023

(30) Foreign Application Priority Data

May 6, 2020   (KR) .................. 10-2020-0053976

(51) Int. Cl.
*H10D 8/60*    (2025.01)
*H10D 8/01*    (2025.01)
(Continued)

(52) U.S. Cl.
CPC ............... *H10D 8/60* (2025.01); *H10D 8/051* (2025.01); *H10D 8/50* (2025.01); *H10D 62/102* (2025.01); *H10D 62/8325* (2025.01)

(58) Field of Classification Search
CPC ............. H01L 29/0607; H01L 29/6606; H01L 29/868; H01L 29/1608; H01L 29/36;
(Continued)

(56) References Cited

U.S. PATENT DOCUMENTS 7,851,881 B1 * 12/2010 Zhao ................... H01L 29/0619
257/155
8,680,587 B2    3/2014 Henning et al.
(Continued)

FOREIGN PATENT DOCUMENTS

JP    2001295459 A    10/2001
JP    2016066813 A    4/2016
(Continued)

OTHER PUBLICATIONS

International Search Report from corresponding PCT Appln. No. PCT/KR2021/005643, dated Sep. 6, 2021.

*Primary Examiner* — Shahed Ahmed
(74) *Attorney, Agent, or Firm* — Grossman, Tucker, Perreault & Pfleger, PLLC; Donald J. Perreault

(57) ABSTRACT

Silicon carbide junction barrier Schottky diode disclosed. Silicon carbide junction barrier Schottky diode includes a first conductivity-type substrate, a first conductivity-type epitaxial layer, being formed by epitaxial growth of silicon carbide doped with a first conductivity-type impurity on the first conductivity-type substrate, a charge injection region, being formed on the first conductivity-type epitaxial layer and doped at a concentration of the first conductivity-type impurity higher than that of the first conductivity-type epitaxial layer, a second conductivity-type junction region, being formed on the first conductivity-type epitaxial layer so
(Continued)

as to contact the charge injection region, a Schottky metal layer, being formed on the charge injection region and the second conductivity-type junction region, an anode electrode, being formed on the Schottky metal layer, and a cathode electrode, being formed under the first conductivity-type substrate.

12 Claims, 11 Drawing Sheets

(51) Int. Cl.
  *H10D 8/50* (2025.01)
  *H10D 62/10* (2025.01)
  *H10D 62/832* (2025.01)

(58) Field of Classification Search
  CPC ..... H01L 21/0495; H01L 29/872–8725; H01L 2924/12; H01L 29/66143; H01L 29/0619–0623; H10D 8/60; H10D 8/051; H10D 8/50; H10D 62/102; H10D 62/8325; H10D 30/0512; H10D 84/611; H10D 48/34
  See application file for complete search history.

(56) References Cited

U.S. PATENT DOCUMENTS

| | | | |
|---|---|---|---|
| 8,952,481 | B2 | 2/2015 | Zhang et al. |
| 9,111,769 | B2 | 8/2015 | Aketa et al. |
| 9,704,949 | B1 | 7/2017 | Ghandi et al. |
| 10,600,874 | B2 | 3/2020 | Takizawa et al. |
| 2007/0228505 | A1* | 10/2007 | Mazzola ............... H01L 29/872 257/E29.328 |
| 2012/0256192 | A1* | 10/2012 | Zhang ................. H01L 29/6606 257/481 |
| 2015/0034970 | A1* | 2/2015 | Aketa ................. H01L 29/0619 257/77 |

FOREIGN PATENT DOCUMENTS

| | | |
|---|---|---|
| JP | 2017112126 A | 6/2017 |
| JP | 2018170509 A | 11/2018 |
| JP | 2019525457 A | 9/2019 |
| KR | 20080052325 A | 6/2008 |
| KR | 1020140074930 A | 6/2014 |
| KR | 20140095080 A | 7/2014 |
| KR | 1020150087335 A | 7/2015 |
| KR | 102038525 B1 | 11/2019 |
| WO | 2018183374 A1 | 10/2018 |

\* cited by examiner

SILICON CARBIDE JUNCTION BARRIER SCHOTTKY DIODE WITH ENHANCED RUGGEDNESS

FIELD

Present invention relates to a power semiconductor.

BACKGROUND

Silicon carbide junction barrier Schottky diode (SiC SBD) has characteristics of low turn-on voltage, junction capacitance, fast recovery time, and high cutoff frequency. Due to these characteristics, SiC SBD is widely used in radio frequency switched-mode power supply (RF SMPS), power management integrated circuit (PIMC), and the like. In order to improve the maximum forward surge current IFSM characteristics and electro-static discharge (ESD) characteristics of the SiC SBD, the width of the P+ region shall be significant. However, if the P+ region is significantly wide, the width of the SBD region is relatively reduced, thereby reducing the forward current.

SUMMARY

According to one aspect of the embodiment according to the present invention, a unit cell constituting an active area of silicon carbide junction barrier Schottky diode is provided. The unit cell includes a first conductivity-type substrate, a first conductivity-type epitaxial layer, being formed by epitaxial growth of silicon carbide doped with a first conductivity-type impurity on the first conductivity-type substrate, a charge injection region, being defined by a second conductivity-type junction region that is formed by ion implantation of a second conductivity-type impurity into a first conductivity-type charge injection layer that is formed by epitaxial growth of silicon carbide doped at a concentration of the first conductivity-type impurity higher than that of the first conductivity-type epitaxial layer on the first conductivity-type epitaxial layer, a Schottky metal layer, being formed on the charge injection region and the second conductivity-type junction region, an anode electrode, being formed on the Schottky metal layer, and a cathode electrode, being formed under the first conductivity-type substrate.

In one embodiment, an area occupied by the second conductivity-type junction region in the unit cell is in a range between 62% and 82%.

In one embodiment, the first conductivity-type charge injection layer includes two or more multi-epitaxial layers having different first conductivity-type impurity concentrations.

In one embodiment, the first conductivity-type impurity concentrations of the two or more multi-epitaxial layers according to a reference concentration profile decrease in a direction toward the first conductivity-type epitaxial layer, wherein the reference concentration profile defines the first conductivity-type impurity concentrations of the two or more multi-epitaxial layers.

In one embodiment, the reference concentration profile decreases the impurity concentration by 20% in the direction toward the first conductivity-type epitaxial layer.

In one embodiment, the first conductivity-type impurity concentrations of each of the two or more multi-epitaxial layers are equally increased by a maximum of 40% or a decrease of a minimum of −40% in the reference concentration profile.

In one embodiment, the depths of two or more multi-epitaxial layers decrease in the direction toward the first conductivity-type epitaxial layer.

In one embodiment, a depth of the second conductivity-type junction region is in a range between 60% and 100% of a depth of the charge injection region.

According to another aspect of the embodiment according to the present invention, a silicon carbide junction barrier Schottky diode having an active area is provided. The silicon carbide junction barrier Schottky diode includes a first conductivity-type substrate, a first conductivity-type epitaxial layer, being formed by epitaxial growth of silicon carbide doped with a first conductivity-type impurity on the first conductivity-type substrate, a charge injection region, being formed on the first conductivity-type epitaxial layer and doped at a concentration of the first conductivity-type impurity higher than that of the first conductivity-type epitaxial layer, a second conductivity-type junction region, being formed on the first conductivity-type epitaxial layer so as to contact the charge injection region, a Schottky metal layer, being formed on the charge injection region and the second conductivity-type junction region, an anode electrode, being formed on the Schottky metal layer, and a cathode electrode, being formed under the first conductivity-type substrate.

BRIEF DESCRIPTION OF THE DRAWINGS

Hereinafter, embodiments of the invention will be described with reference to the accompanying drawings. For the purpose of easy understanding of the invention, the same elements will be referred to by the same reference signs. Configurations illustrated in the drawings are examples for describing the invention, and do not restrict the scope of the invention. Particularly, in the drawings, some elements are slightly exaggerated for the purpose of easy understanding of the invention. Since the drawings are used to easily understand the invention, it should be noted that widths, depthes, and the like of elements illustrated in the drawings might change at the time of actual implementation thereof. Meanwhile, throughout the detailed description of the invention, the same components are described with reference to the same reference numerals.

DETAILED DESCRIPTION

Figure 1:
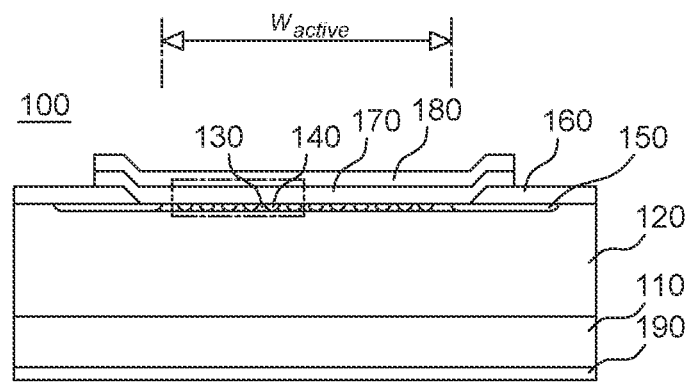
FIG. 1 is a schematic cross-sectional view of SiC SBD with enhanced ruggedness.

Embodiments which will be described below with reference to the accompanying drawings can be implemented singly or in combination with other embodiments. But this is not intended to limit the present invention to a certain embodiment, and it should be understood that all changes, modifications, equivalents or replacements within the spirits and scope of the present invention are included. Especially, any of functions, features, and/or embodiments can be implemented independently or jointly with other embodiments. Accordingly, it should be noted that the scope of the invention is not limited to the embodiments illustrated in the accompanying drawings.

Terms such as first, second, etc., may be used to refer to various elements, but these element should not be limited due to these terms. These terms will be used to distinguish one element from another element.

The terms used in the following description are intended to merely describe specific embodiments, but not intended to limit the invention. An expression of the singular number includes an expression of the plural number, so long as it is clearly read differently. The terms such as "include" and "have" are intended to indicate that features, numbers, steps, operations, elements, components, or combinations thereof used in the following description exist and it should thus be understood that the possibility of existence or addition of one or more other different features, numbers, steps, operations, elements, components, or combinations thereof is not excluded.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings.

FIG. 1 is a schematic cross-sectional view of silicon carbide junction barrier Schottky diode (SiC SBD) with enhanced ruggedness.

SiC SBD 100 includes an active area and an edge termination area surrounding at least a portion of the active area. The active area includes a Schottky junction and a PN junction. The edge termination area may have various structures such as a guard ring, a bevel, and a junction termination extension.

SiC SBD 100 includes a first conductivity-type substrate 110, a first conductivity-type epitaxial layer 120, a charge injection region 130, a second conductivity-type junction region 140, a second conductivity-type buffer region 150, an insulating layer 160, a Schottky metal layer 170, an anode electrode 180, and a cathode electrode 190. Here, the first conductivity-type refers to a region or a layer doped by an n-type impurity, and the second conductivity-type refers to the region or layer doped by a p-type impurity, but it can be understood that the reverse case is also possible.

The first conductivity-type substrate 110 may be formed by doping the first conductivity-type impurity on a 4H-SiC or 6H-SiC substrate. For example, the concentration of the first conductivity-type impurity in the first conductivity-type substrate 110 may be about 1E18 $cm^{-2}$, and the depth of the first conductivity-type substrate 110 may be about 5 μm.

The first conductivity-type epitaxial layer 120 may be formed by epitaxial growth of silicon carbide doped with the first conductivity-type impurity on the first conductivity-type substrate 110. For example, the concentration of the first conductivity-type impurity in the first conductivity-type epitaxial layer 120 may be about 1E16 $cm^{-2}$, and the depth of the first conductivity-type epitaxial layer 120 may be about 11 μm.

The charge injection region 130 may be formed in the active area on an upper surface of the first conductivity-type epitaxial layer 120. The charge injection region 130 may have a higher impurity concentration than the first conductivity-type epitaxial layer 120. For example, the concentration of the first conductivity-type impurity in the charge injection region 130 may be at least 1.2E16 $cm^{-2}$ up to 1.4E17 $cm^{-2}$, which may be at least 1.2 to 1.4 times the impurity concentration of the first conductivity-type epitaxial layer 120. The depth of the charge injection region 130 may be about 0.6 μm to about 1.0 μm. Meanwhile, the impurity concentration of the charge injection region 130 may be different depending on the depth from the upper surface. For example, the impurity concentration of the charge injection region 130 may decrease as the distance from the upper surface increases.

As the concentration of the first conductivity-type impurity increases, a resistivity of the charge injection region 130 decreases. When the resistivity of the charge injection region 130 in contact with the Schottky metal layer decreases, an amount of charges passing through the Schottky junction increases and the current increases accordingly.

The plurality of second conductivity-type junction regions 140 may be formed in the active area on the upper surface of the first conductivity-type epitaxial layer 120. The plurality of second conductivity-type junction regions 140 may be formed by an ion implantation of the second conductivity-type impurity into the first conductivity-type charge injection layer 130' (see FIG. 2) at a relatively high concentration. For example, the concentration of the second conductivity-type impurity implanted into the second conductivity-type junction region 140 may be about 1E18 $cm^{-2}$, and the depth of the second conductivity-type junction region 140 may be about 0.6 μm. By the ion implantation, the plurality of second conductivity-type junction regions 140 may be formed to extend from the upper surface of the first conductivity-type charge injection layer 130' into the first conductivity-type charge injection layer 130'. A ratio of area occupied by the second conductivity-type junction region 140 in the active area may be at least 62% and up to 82%.

The second conductivity-type buffer region 150 may be formed throughout the active area and the edge termination area on the upper surface of the first conductivity-type epitaxial layer 120 and surrounds the active area. Specifically, in a horizontal direction, one end of the second conductivity-type buffer region 150 extends beyond the insulating layer 160 and contacts the Schottky metal layer 170, and the other end of the second conductivity-type buffer region 150 extends toward the edge termination area. The second conductivity-type buffer region 150 extending to the edge termination area contacts the insulating layer 160 but does not extend beyond the insulating layer 160. The second conductivity-type buffer region 150 may be formed by ion implantation of the second conductivity-type impurity into the first conductivity-type charge injection layer 130' (see FIG. 2). The width of the second conductivity-type buffer region 150 may be wider than that of the second conductivity-type junction region 140. The second conductivity-type buffer region 150 has a function of dispersing an electric field while maintaining a breakdown voltage of the device.

The insulating layer 160 may be formed on a portion of the buffer layer 150 and on the first conductivity-type epitaxial layer 120 in the edge termination area. The insulating layer 160 may be formed to surround the plurality of second conductivity-type junction regions 140 to define an active area. The insulating layer 160 may be formed to overlap at least a portion of the second conductivity-type buffer region 150. The insulating layer 160 may be formed of silicon oxide, phosphosilicate glass (PSG), borosilicate glass (BSG), borophosphosilicate glass (BPSG), and the like.

The Schottky metal layer 170 may be formed on the first conductivity-type epitaxial layer 120, contacts the upper surfaces of the plurality of second conductivity-type junction regions 140, and has Schottky junction with a portion of first conductivity-type epitaxial layer 120. The Schottky metal layer 170 may extend in the horizontal direction to cover a portion of the insulating layer 160.

The anode electrode 180 may be formed over the Schottky metal layer 170, and the cathode electrode 190 may be formed under the first conductivity-type substrate 110. The anode electrode 180 and the cathode electrode 190 may be formed of a metal or a metal alloy. A silicide layer (not shown) for ohmic contact may be formed between the first conductivity-type substrate 110 and the cathode electrode 190.

The operation of the above-described SiC SBD 100 will be described.

The plurality of second conductivity-type junction regions 140 are PN-junctioned with the first conductivity-type charge injection region 130. Accordingly, the plurality of second conductivity-type junction regions 140 and the first conductivity-type charge injection region 130 perform the same function as a PiN diode. That is, SiC SBD 100 has a structure in which a junction barrier Schottky diode (hereinafter referred to as SBD) and a PiN diode are connected in parallel.

In off state of SiC SBD 100, the SBD and the PiN diode simultaneously maintain the off-state voltage. Since a depth from the lower portion of the PiN diode to the first conductivity-type substrate 110 is smaller than a depth from the lower portion of the SBD to the first conductivity-type substrate 110, a relatively strong off-state electric field is applied to the PiN diode and, as a result, a relatively weak off-state electric field is applied to the SBD. In other words, due to the PiN diode, the electric field applied to an interface of the Schottky junction decreases, thereby reducing the leakage current.

The turn-on voltage of the PiN diode is relatively higher than that of the SBD. In on state, when a forward voltage $V_F$ is applied to the PiN diode and SBD connected in parallel, current starts to flow through the SBD having a relatively low turn-on voltage. Then, when the forward voltage $V_F$ increases above the turn-on voltage of the PiN diode, current flows through both the PiN diode and the SBD. For this reason, in the known JBS diode, the current density characteristic in the on state decreases compared to a conventional SBD in which current flows through the entire active area. On the other hand, in SiC SBD 100 according to one embodiment of the present invention, the charge injection region 130 increases the current density, and thus substantially the same current density as that of the known JBS diodes can be achieved, even if the area of the second conductivity-type junction region 140 increases.

Figure 2:
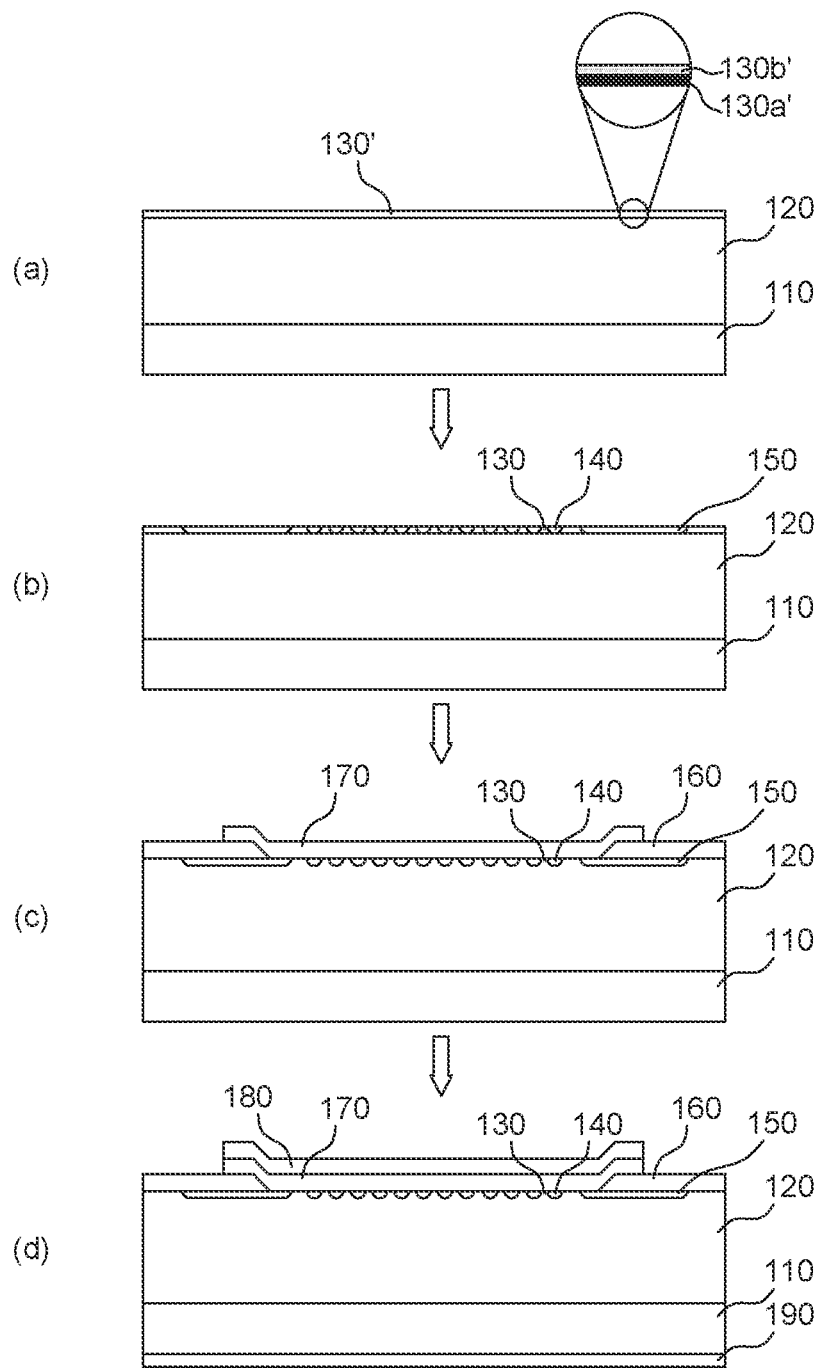
FIG. 2 exemplarily illustrates a process of manufacturing the SiC SBD shown in FIG. 1.

FIG. 2 exemplarily illustrates a process of manufacturing the SiC SBD shown in FIG. 1. The charge injection region 130 may be formed by the ion implantation or a multi-epitaxial process. Hereinafter, a process of manufacturing the SiC SBD by use of the multi-epitaxial process will be described.

In step (a), the first conductivity-type charge injection layer 130' may be formed on the upper surface of the first conductivity-type epitaxial layer 120. The first conductivity-type epitaxial layer 120 is epitaxially grown on the upper surface of the first conductivity-type substrate 110. The first conductivity-type substrate 110 has a depth of about 5 µm, and may be doped with the first conductivity-type impurity at a concentration of about 1E18 cm$^{-2}$. Meanwhile, the depth of the first conductivity-type epitaxial layer 120 is about 11 µm and may be doped with the first conductivity-type impurity at a concentration of about 1E16 cm$^{-2}$.

The doping concentration of the first conductivity-type charge injection layer 130' may be consistent regardless of depth or vary with depth. The first conductivity-type charge injection layer 130' may be multi-epitaxial layers 130a' and 130b'. Doping concentrations of the first multi-epitaxial layer 130a' and the second multi-epitaxial layer 130b' may be different. For example, the doping concentration of the first multi-epitaxial layer 130a' may be lower than that of the second multi-epitaxial layer 130b'.

The depth of the first conductivity-type charge injection layer 130' may be changed according to the number of multi-epitaxial layers 130a' and 130b'. The number of the multi epitaxial layers 130a' and 130b' may be 2 to 5, for example. Accordingly, the depth of the first conductivity-type charge injection layer 130' may be about 0.6 µm to about 1.0 µm.

In step (b), a plurality of second conductivity-type junction regions 140 may be formed in the first conductivity-type charge injection layer 130'. Meanwhile, the second conductivity-type buffer region 150 may be formed simultaneously with the plurality of second conductivity-type junction regions 140. A photoresist is applied to the upper surface of the first conductivity-type epitaxial layer 120, and the photoresist located in the region to be ion implanted is removed. Thereafter, the second conductivity-type impurity may be implanted. Meanwhile, a plurality of guard rings may be formed in the second conductivity-type buffer region 150.

In step (c), the insulating layer 160 may be formed on the upper surface of the first conductivity-type epitaxial layer 120, and the Schottky metal layer 170 may be formed in the active area. The insulating layer 160 may be formed by forming an insulating film of silicon oxide, PSG, BSG, BPSG, or the like on the entire upper surface of the first conductivity-type epitaxial layer 120, and then removing the insulating film corresponding to the active area. Schottky metal layer 170 may be formed of a material having a low energy barrier or an alloy of two or more metals, for example, any one or a combination of titanium, chromium, polysilicon, aluminum, and tantalum.

In step (d), the anode electrode 180 may be formed on the Schottky metal layer 170 and the cathode electrode 190 may be formed under the first conductivity-type substrate 110, respectively. The electrodes may be formed of, for example, aluminum.

Figure 3:
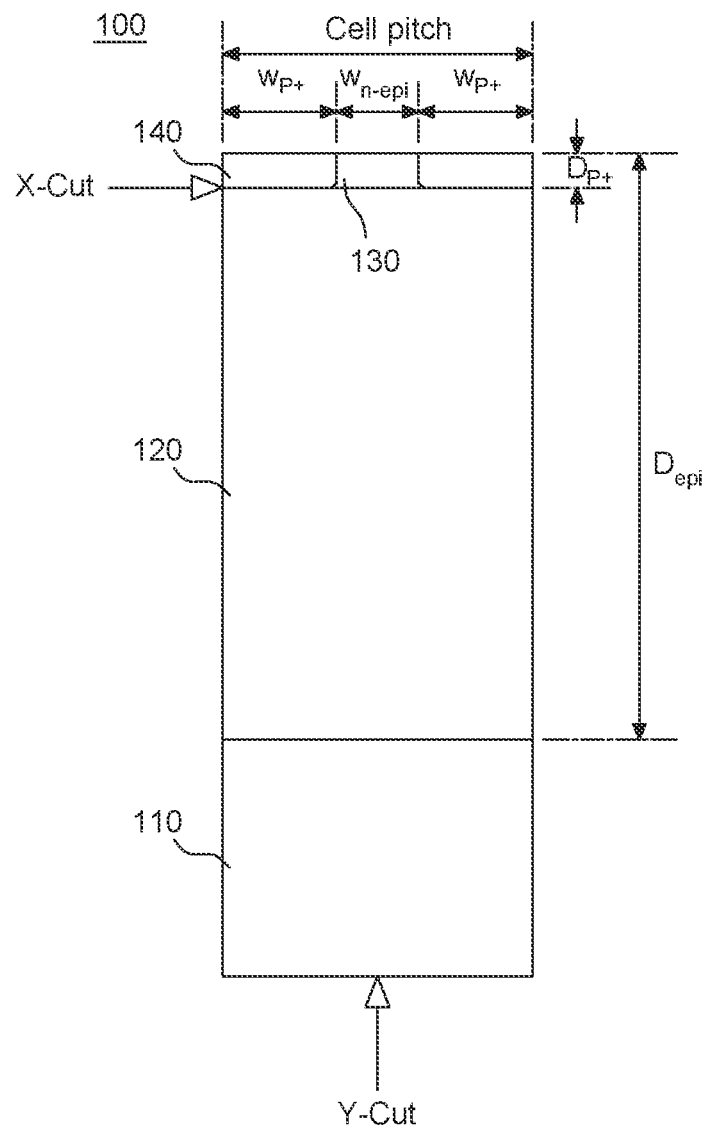
FIG. 3 is a cross-sectional view exemplarily illustrating one embodiment of a unit cell constituting the active area of the SiC SBD shown in FIG. 1.

FIG. 3 is a cross-sectional view exemplarily illustrating one embodiment of a unit cell constituting the active area of the SiC SBD shown in FIG. 1.

Referring to FIG. 3, the SiC SBD 100 may include the charge injection region 130 doped with a uniform concentration. The charge injection region 130 may be formed by doping, for example, the first conductivity-type impurity at a concentration of about 1E16 cm$^{-2}$. The cell pitch of the SiC SBD 100 is about 3.5 μm, and the ratio within the cell pitch between a width $W_{n\text{-}epi}$ of the charge injection region 130 and a width $2 \times W_{P+}$ of the second conductivity-type junction region 140 is 1.0:2.5. Hereinafter, it is assumed that the cell pitch of the SiC SBD 100 is 3.5 μm, and the width of the second conductivity-type junction region 140 is referred to as RJBS. The width $W_{n\text{-}epi}$ of the charge injection region 130 may be about 1.0 μm and a depth $D_{P+}$ may be about 0.6 μm. The RJBS may be about 2.5 μm, and a depth of the second conductivity-type junction region 140 may be about 0.6 μm. The second conductivity-type junction region 140 may be formed by doping, for example, the second conductivity-type impurity at a concentration of about 1E18 cm$^2$. Meanwhile, a depth $D_{epi}$ from the upper surface of the first conductivity-type substrate 110 to the upper surface of the second conductivity-type junction region 140 may be about 12 μm.

The design parameters described above were selected for the purpose of comparison with the known JBS diode. Design parameters other than the depth of the charge injection region 130, the first conductivity-type epitaxial layer 120, and the RJBS are the same both in the known JBS diode and the SiC SBD 100. In the known JBS diode, when the depth of the first conductivity-type epitaxial layer is about 12 μm, the RJBS is about 1.24 μm, and the forward voltage $V_F$ is about 0.76 V, a current of about 10 A may flow. In order to flow the substantially same forward current by applying the substantially same forward voltage $V_F$, the RJBS of the SiC SBD 100 is selected to be about 2.5 μm.

Figure 4:
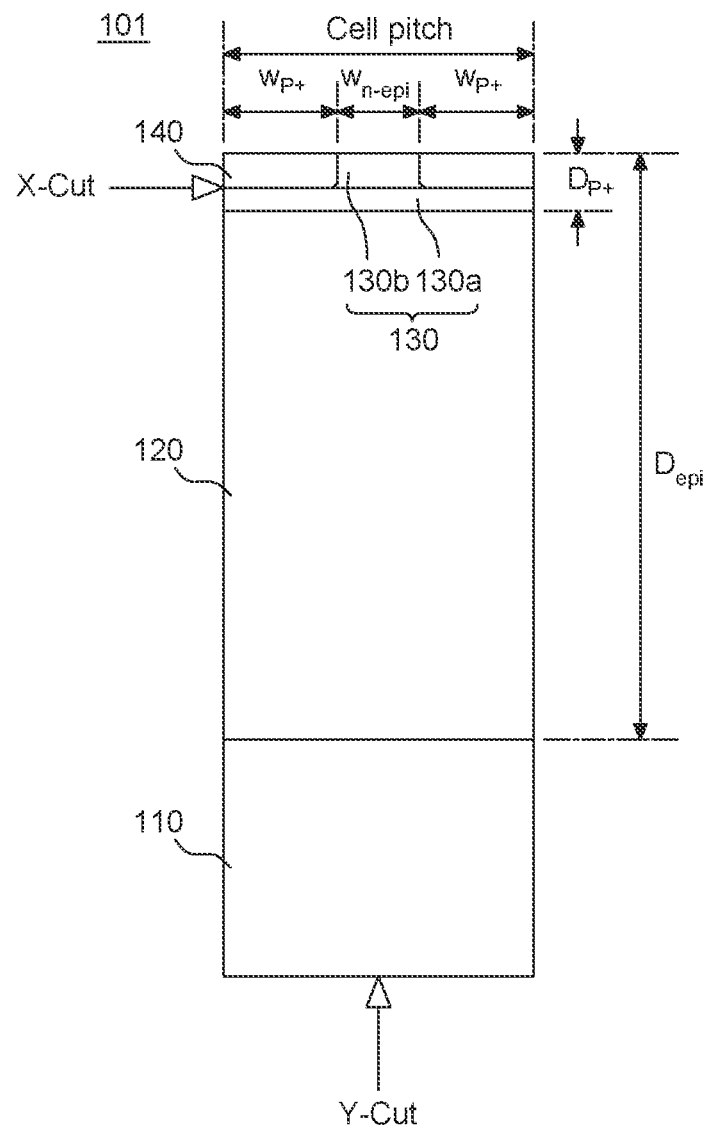
FIG. 4 is a cross-sectional view exemplarily illustrating another embodiment of a unit cell constituting the active area of the SiC SBD shown in FIG. 1.

FIG. 4 is a cross-sectional view exemplarily illustrating another embodiment of a unit cell constituting the active area of the SiC SBD shown in FIG. 1.

Referring to FIG. 4, the SiC SBD 101 may include the charge injection region 130 composed of two multi-epitaxial layers 130a and 130b doped with different concentrations. The first multi-epithelial layer 130a may be formed by doping the first conductivity-type impurity at a concentration of about 3E16 cm$^{-2}$ and may have a depth of about 0.6 μm. The second multi epitaxial layer 130b may be formed by doping the first conductivity-type impurity at a concentration of about 1E17 cm$^{-2}$ and may have a depth of about 0.4 μm. The cell pitch of the SiC SBD 101 may be about 3.5 μm, and the RJBS may be about 2.6 μm. The second conductivity-type junction region 140 may be formed by doping, for example, the second conductivity-type impurity at a concentration of about 1E18 cm$^{-2}$. The depth $D_{P+}$ of the second conductivity-type junction region 140 may be about 0.6 μm. Meanwhile, the depth $D_{epi}$ from the upper surface of the first conductivity-type substrate 110 to the upper surface of the second conductivity-type junction region 140 may be about 12 μm.

The design parameters described above were selected for the purpose of comparison with the known JBS diode. The design parameters other than the charge injection region 130 and RJBS are the same both in the known JBS diode and the SiC SBD 101. In the known JBS diode, when the depth of the first conductivity-type epitaxial layer is about 12 μm, the RJBS is about 0.9 μm, and the forward voltage $V_F$ is about 0.66 V, a current of about 10 A may flow. In order to flow a forward current of 10 A by applying a forward voltage $V_F$ of 0.68 V, the RJBS of the SiC SBD 100 is selected to be about 2.6 μm.

Figure 5:
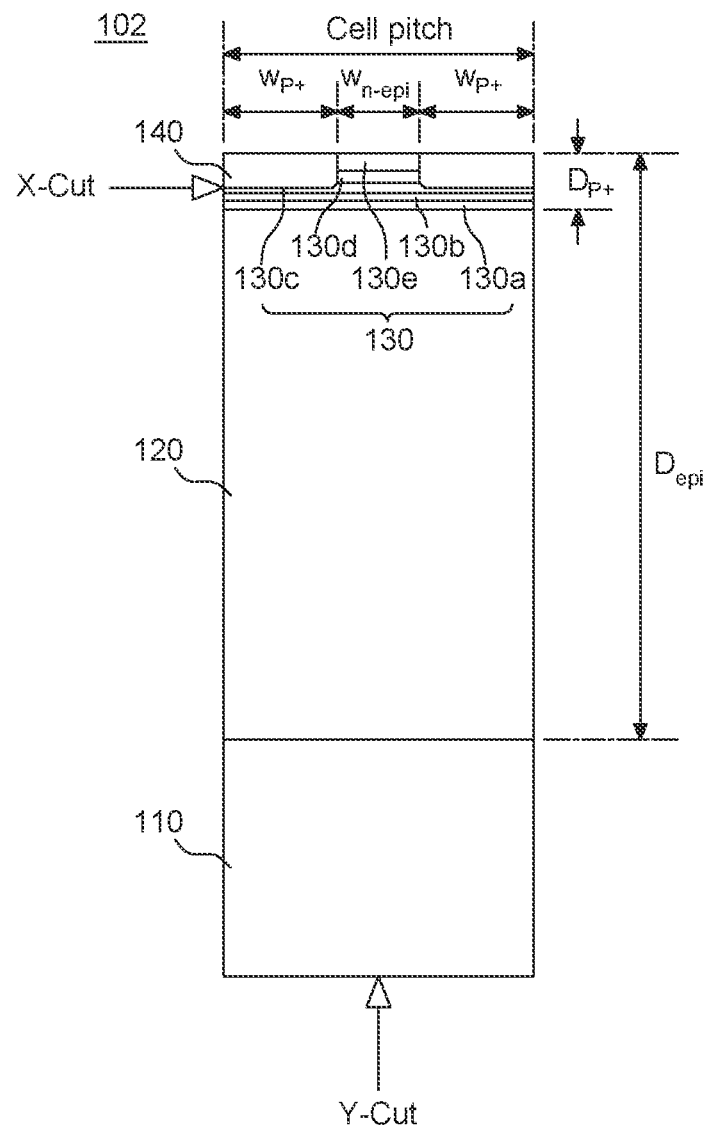
FIG. 5 is a cross-sectional view exemplarily illustrating still another embodiment of a unit cell constituting the active area of the SiC SBD shown in FIG. 1.

FIG. 5 is a cross-sectional view exemplarily illustrating still another embodiment of a unit cell constituting the active area of the SiC SBD shown in FIG. 1.

Referring to FIG. 5, the SiC SBD 102 may have a charge injection region 130 composed of five multi-epitaxial layers 130a, 130b, 130c, 130d, and 130e doped with different concentrations. The first multi epitaxial layer 130a may be formed by doping the first conductivity-type impurity at a concentration of about 2E16 cm$^{-2}$ and may have a depth of about 0.1 μm. The second multi epitaxial layer 130b may be formed by doping the first conductivity-type impurity at a concentration of about 4E16 cm$^{-2}$ and may have a depth of about 0.15 μm. The third multi epitaxial layer 130c may be formed by doping the first conductivity-type impurity at a concentration of about 6E16 cm$^{-2}$ and may have a depth of about 0.2 μm. The fourth multi epitaxial layer 130d may be formed by doping the first conductivity-type impurity at a concentration of about 8E16 cm$^{-2}$ and may have a depth of about 0.2 μm. The fifth multi-epithelial layer 130e may be formed by doping the first conductivity-type impurity at a concentration of about 1E17 cm$^{-2}$ and may have a depth of about 0.3 μm. The cell pitch of the SiC SBD 102 may be about 3.5 μm, and the RJBS may be about 2.6 μm. The second conductivity-type junction region 140 may be formed by doping, for example, the second conductivity-type impurity at a concentration of about 1E18 cm$^{-2}$. The depth $D_{P+}$ of the second conductivity-type junction region 140 may be about 0.6 μm. Meanwhile, a depth from the lower surface of the charge injection region 130 to the upper surface of the first conductivity-type substrate 110, that is, the depth of the first conductivity-type epitaxial layer 120 may be about 11 μm. The depth of the first conductivity-type epitaxial layer 120 may vary according to a desired breakdown voltage requirement. In general, the depth of the first conductivity-type epitaxial layer 120 in the case of 650 V class diode is designed to be about 5 to about 7 μm, the depth of the first conductivity-type epitaxial layer 120 in the case of 1200 V class diode is designed to be about 10 to about 12 μm, and the depth of the first conductivity-type epitaxial layer 120 in the case of 1700 V class diode is designed to be about 15 μm or more.

The design parameters described above were selected for the purpose of comparison with the known JBS diode. The design parameters other than the charge injection region 130 and RJBS are the same both in the known JBS diode and SiC SBD 102. In the known JBS diode, when the depth of the first conductivity-type epitaxial layer is about 12 μm, the RJBS is about 0.9 μm, and the forward voltage $V_F$ is about 1.16 V, a current of about 10 A may flow. In order to flow a forward current of 10 A when the forward voltage $V_F$ is about 1.18 V, the RJBS of the SiC SBD 102 is selected to be about 2.6 μm.

FIG. 6, FIG. 7, FIG. 8 and FIG. 9 are graphs exemplarily illustrating electrical characteristics of the SiC SBD shown in FIGS. 3 through 5.

Figure 6:
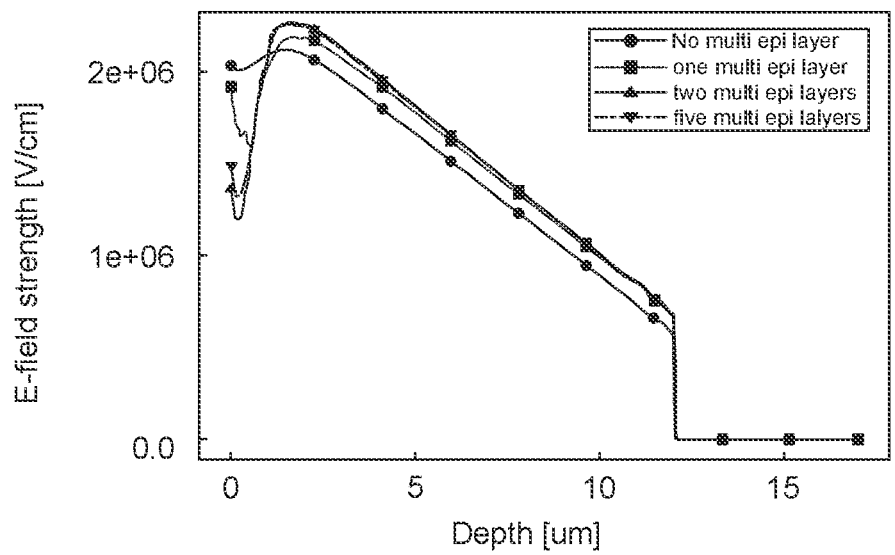
FIG. 6, FIG. 7, FIG. 8 and FIG. 9 are graphs exemplarily illustrating electrical characteristics of the SiC SBD shown in FIGS. 3 to 5.

FIG. 6 shows vertical electric fields applied to the SiC SBDs 100, 101, and 102 illustrated in FIGS. 3 to 5, and FIG. 7 shows horizontal electric fields. The vertical electric field is an electric field distributed between the Schottky junction and the lower surface of the first conductivity-type substrate 110 (indicated by Y-cut in FIGS. 3 through 5), and the horizontal electric field is an electric field distributed between the lower surfaces of the two the second conductivity-type junction regions 140 (indicated by X-cut in FIGS. 3 through 5). The known JBS diode to be compared has the design parameters described in FIGS. 3 through 5.

When seeing the graph in FIG. 6, which shows the electric fields in the vertical direction, the electric field strength tends to decrease-increase-decrease in the vertical direction from the Schottky junction. The electric field strength decreases substantially linearly in the first conductivity-type epitaxial layer beyond an area in which the electric field is concentrated by the second conductivity-type junction region, and substantially disappears in the first conductivity-type substrate. This tendency is observed in both known JBS and the SiC SBDs 100, 101, and 102. However, there is a significant difference in the electric field strength at (or near) the Schottky junction. The electric field strength at the Schottky junction is about 2e+06 V/cm or more in the known JBS diode, while about 1.9e+05 V/cm in the SiC SBD 100 having the charge injection region doped with a single concentration and about 1.5e+05 V/cm in the SiC SBD 101 having the charge injection region consisting of two multi-epitaxial layers. Even in the SiC SBD 102 having the charge injection region consisting of five multi-epitaxial layers, the electric field strength at the Schottky junction decreases to about 1.3e+05 V/cm. The electric field strength at the Schottky junction is a dominant factor that causes leakage current of the Schottky diode, and the leakage current decreases as the electric field strength decreases.

Figure 7:
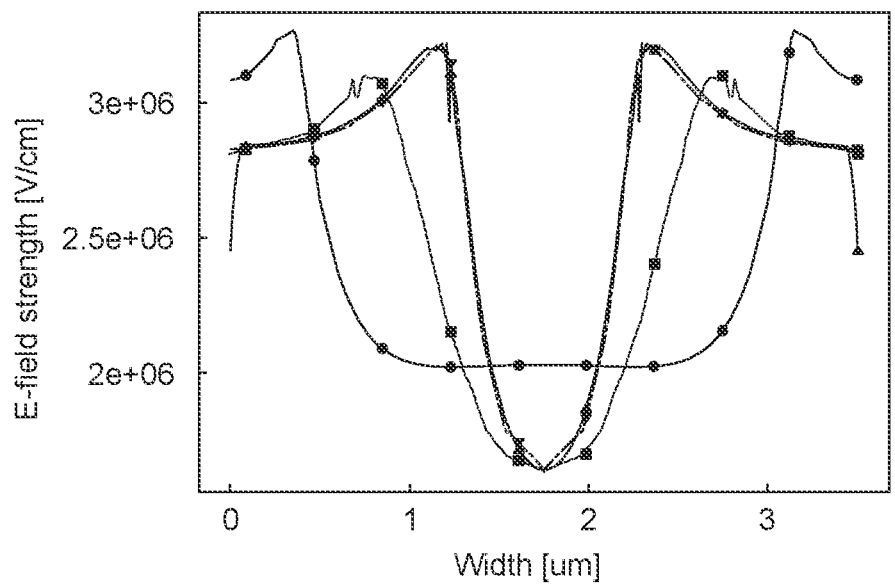

The same phenomenon is also observed in FIG. 7 showing the electric fields in the horizontal direction. In the known JBS diode in which the distance between the second conductivity-type junction regions is relatively large, the electric field strength between opposite junction regions remains substantially constant due to the distance between the opposite junction regions. On the other hand, as the width of the second conductivity-type junction regions increases, the distance between the junction regions with the maximum electric field strength decreases. Due to this, the electric fields formed between the junction regions continue to decrease, so that the electric field strength at the center of the cell becomes relatively weaker than that of the known JBS diode. Therefore, the strength of the electric field applied to the Schottky junction is relatively reduced compared to the electric field in the known JBS diode.

Figure 8:
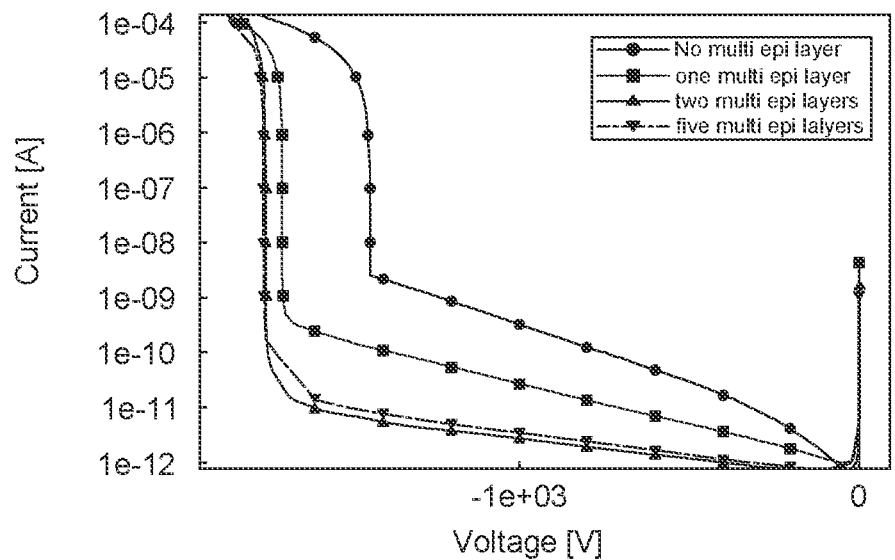
Figure 9:
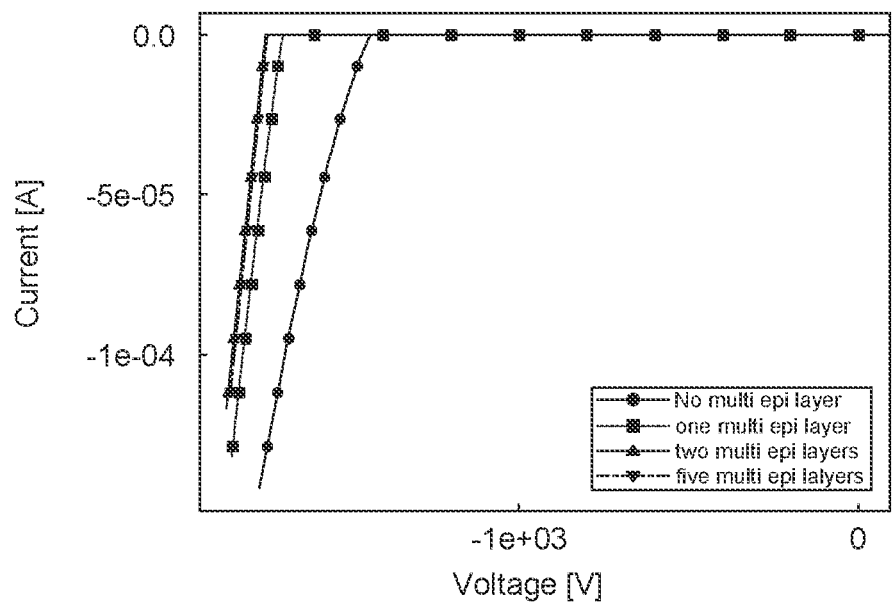

FIG. 8 shows leakage currents, and FIG. 9 shows breakdown voltages in the SiC SBDs 100, 101, and 102 illustrated in FIGS. 3 through 5. As predicted from the electric field strength graphs of FIGS. 6 and 7, it can be seen that the increase rate of leakage currents of the SiC SBDs 100, 101, and 102 in which the charge injection region 130 may be formed is significantly lower than that of the known JBS diode. In addition, when seeing the breakdown voltages, the breakdown voltage of the known JBS diode is about −1,430 V, whereas the breakdown voltages of the SiC SBDs 100, 101, and 102 in which the charge injection region 130 may be formed is about −1,700 V.

FIGS. 10 through 13 are graphs exemplarily illustrating electrical characteristics according to a change in doping concentration of the SiC SBD shown in FIG. 5.

The doping concentration of the SiC SBD is changed to 60%, 80%, 120% and 140% of a reference concentration profile based on the doping concentration illustrated in FIG. 5. The depths of the first to fifth multi-epitaxial layers 130a though 130e and RJBS are not changed. The concentration profiles increased and decreased in increments of 20% are shown in Table 1. The design parameters except for the doping concentration profile are the same as those of the embodiment illustrated in FIG. 5.

TABLE 1

|  | Fifth multi-epitaxial layer | Fourth multi-epitaxial layer | Third multi-epitaxial layer | Second multi-epitaxial layer | First multi-epitaxial layer | First conductivity-type epitaxial layer |
|---|---|---|---|---|---|---|
| Epi Depth (μm) | 0.3 | 0.2 | 0.2 | 0.15 | 0.1 | 11 |
| Epi Doping (cm$^{-2}$) [60%] | 6.0E16 | 4.8E16 | 3.6E16 | 2.4E16 | 1.2E16 | 1E16 |
| Epi Doping (cm$^{-2}$) [80%] | 8.0E16 | 6.4E16 | 4.8E16 | 3.2E16 | 1.6E16 | 1E16 |
| Epi Doping (cm$^{-2}$) [Ref] | 1.0E17 | 8.0E16 | 6.0E16 | 4.0E16 | 2.0E16 | 1E16 |
| Epi Doping (cm$^{-2}$) [120%] | 1.2E17 | 9.6E16 | 7.2E16 | 4.8E16 | 2.4E16 | 1E16 |
| Epi Doping (cm$^{-2}$) [140%] | 1.4E17 | 1.12E17 | 8.4E16 | 5.6E17 | 2.8E16 | 1E16 |

Figure 10:
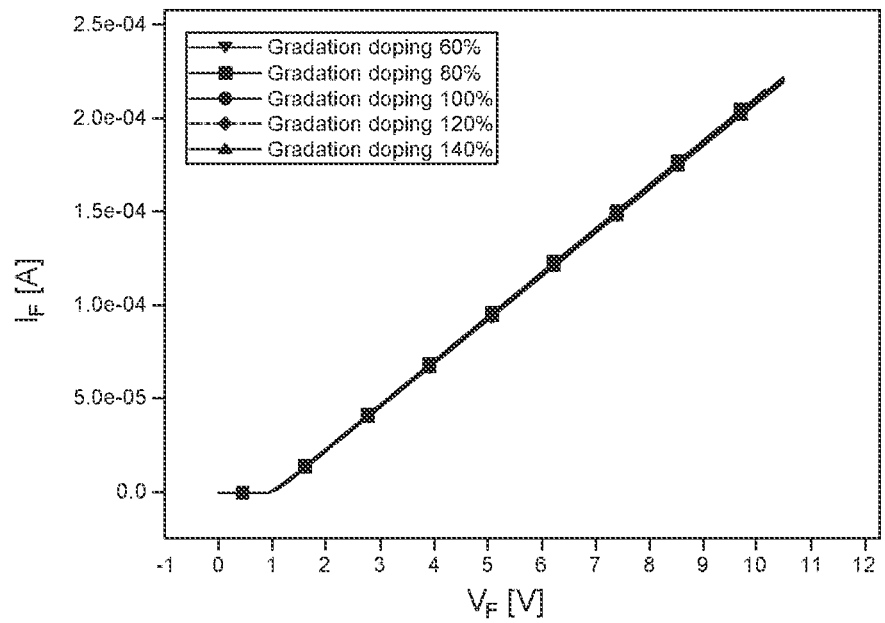
FIG. 10, FIG. 11, FIG. 12 and FIG. 13 are graphs exemplarily illustrating electrical characteristics according to a change in doping concentration of the SiC SBD shown in FIG. 5.

FIG. 10 shows the characteristics of the forward voltage $V_F$ and the forward current $I_F$ of the SiC SBDs formed according to the five concentration profiles illustrated in Table 1. As illustrated, it can be seen that the change in the doping concentration does not significantly affect the forward voltage-current characteristics.

Figure 11:
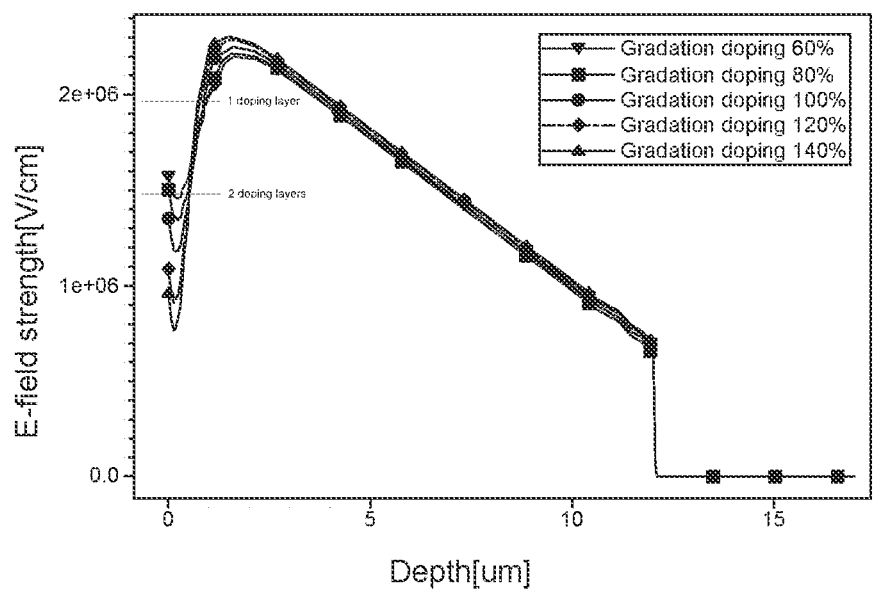
Figure 12:
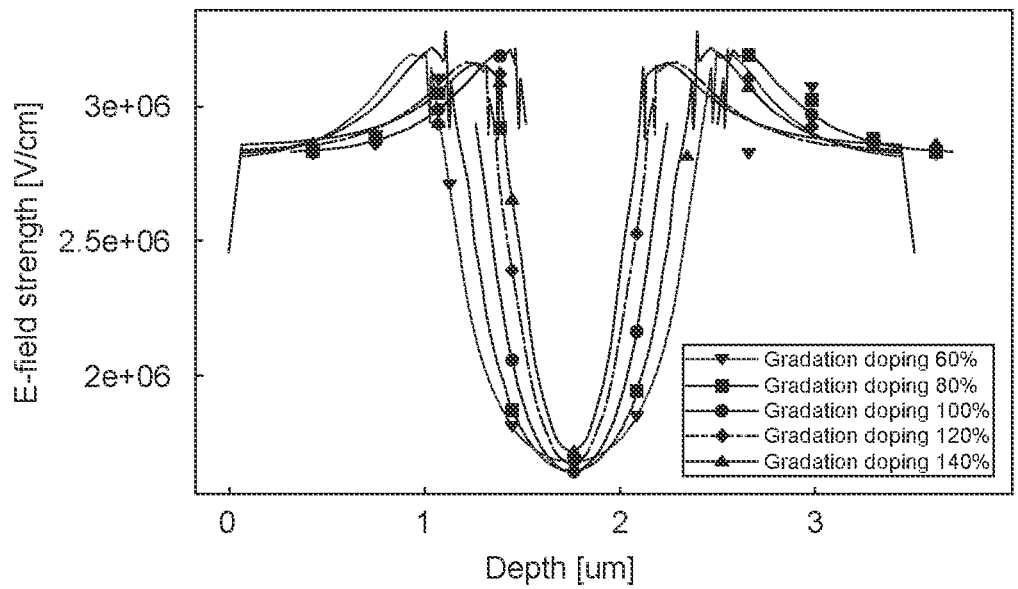

FIG. 11 shows vertical electric fields of the SiC SBDs formed according to five concentration profiles illustrated in Table 1, and FIG. 12 shows horizontal electric fields. Referring to FIG. 11, it can be seen that the electric field strength at the Schottky junction decreases as the doping concentration increases. It can be seen that for all of the vertical electric fields of the SiC SBDs according to the five concentration profiles, the electric field strength at the Schottky junction is weaker than that case that the charge injection region may be formed at a single concentration. On the other hand, it can be seen that the electric field strength at the Schottky junction in the vertical electric fields at the relatively low concentration profiles (60% and 80%) is relatively high or almost similar than the case in which the charge injection region is formed of two multi-epitaxial layers. As previously seen in FIG. 6, the electric field strength in the vertical direction of the SiC SBD having the charge injection region is minimal near the lower edge of the second conductivity-type junction region, then increases rapidly to maximum, and decreases almost linearly across the first conductivity-type epitaxial layer.

Referring to FIG. 12, the horizontal electric fields of the SiC SBDs according to the five concentration profiles tend to have maximum electric field strengths of which width between them is narrow and extends vertically downward. Based on the electric field strength according to the reference concentration profile, the horizontal electric fields according to the relatively low concentration profiles have a relatively wide width between the maximum electric field strengths, whereas the horizontal electric fields according to the relatively high concentration profiles have a relatively narrow width between the maximum electric field strengths. It can be seen that as the doping concentration increases, the electric field strength applied between the junction regions increases.

Figure 13:
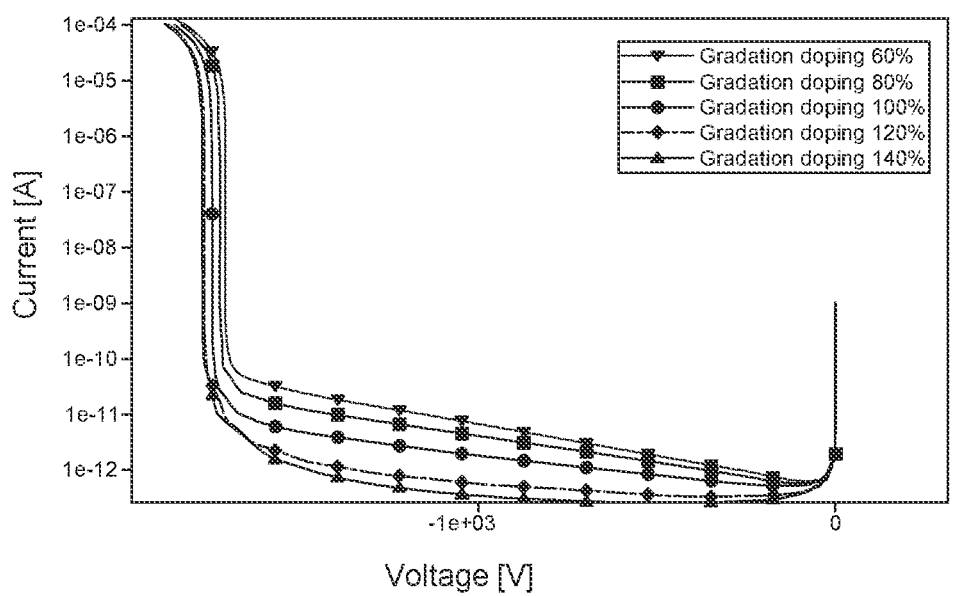

Referring to FIG. 13, as predicted from FIGS. 11 and 12, it can be seen that the leakage current decreases as the doping concentration increases. Based on the leakage current curve according to the reference concentration profile as a reference, for relatively low concentration profiles, the increase rate of the leakage current is greater than that of the reference concentration profile and increases almost linearly over a certain range. On the other hand, in the relatively high concentration profiles, although the magnitude of the leakage current as a whole is smaller than that of the reference concentration profile, it tends to increase non-linearly.

Figure 14:
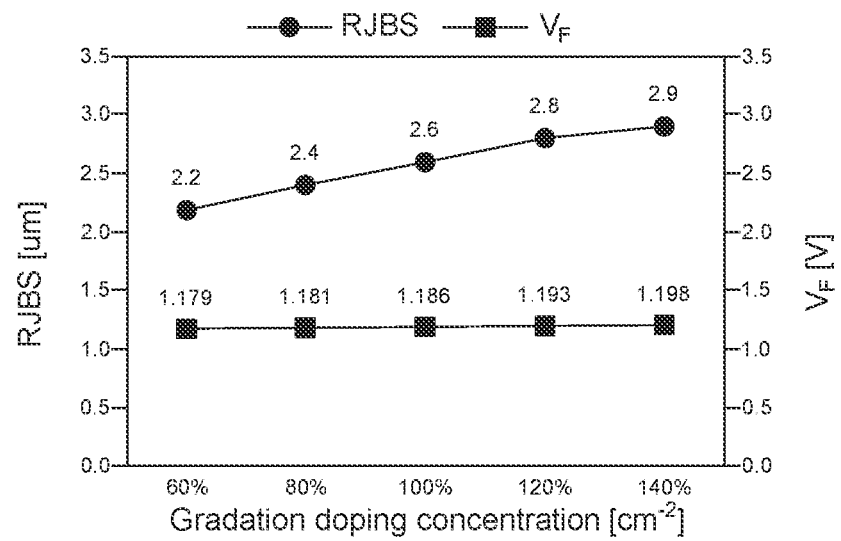
FIG. 14 and FIG. 15 are graphs exemplarily illustrating a function of the charge injection region.
Figure 15:
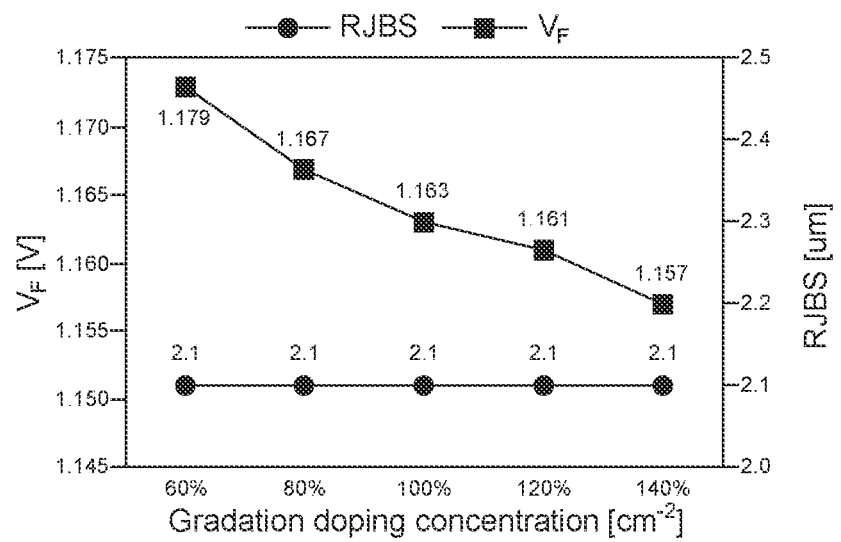

FIG. 14 and FIG. 15 are graphs exemplarily illustrating a function of the charge injection region.

The charge injection region increases the current density. When the charge injection region may be formed over the entire upper portion of the first conductivity-type epitaxial layer, the amount of current passing through the first conductivity-type epitaxial layer increases, and a thermal runaway phenomenon may occur. Thermal runaway may increase the temperature of the package and cause damage to the surrounding area, and in particular, it is the dominant factor that increases the leakage current. Accordingly, the second conductivity-type junction region must be formed in the charge injection region to prevent excessive current from flowing.

The degree to which the charge injection region increases the current density may vary according to the concentration profile of the multi-epitaxial layer. FIG. 14 shows the result of adjusting the RJBS so that the forward voltage $V_F$ is about 1.18 V and the forward current $I_F$ is about 10 A. For the five concentration profiles with the depth of the second conductivity-type junction region equal to about 0.6 µm, RJBS for having the forward voltage $V_F$ of about 1.18 V and the forward current $I_F$ of about 10 A for each concentration profile is determined. As shown, for the concentration profiles relatively lower than the reference concentration profile, RJBS should be decreased, and conversely, for the relatively high concentration profiles, RJBS should be increased, so that VF=1.18 V and IF=10 can be satisfied. From these measurement results, it can be confirmed that the charge injection region increases the current density.

Meanwhile, FIG. 15 shows the forward voltage $V_F$ when the forward current $I_F$ becomes about 10 A while RJBS is fixed at 2.1 µm. For the five concentration profiles in which the depth of the second conductivity-type junction region is equal to about 0.6 µm, the forward voltages $V_F$ when the forward current $I_F$ is about 10 A are measured. As shown, it can be seen that as the concentration profile increases, the forward voltage $V_F$ decreases. As with FIG. 14, it can be confirmed that the charge injection region increases the current density from these measurement results.

Figure 16:
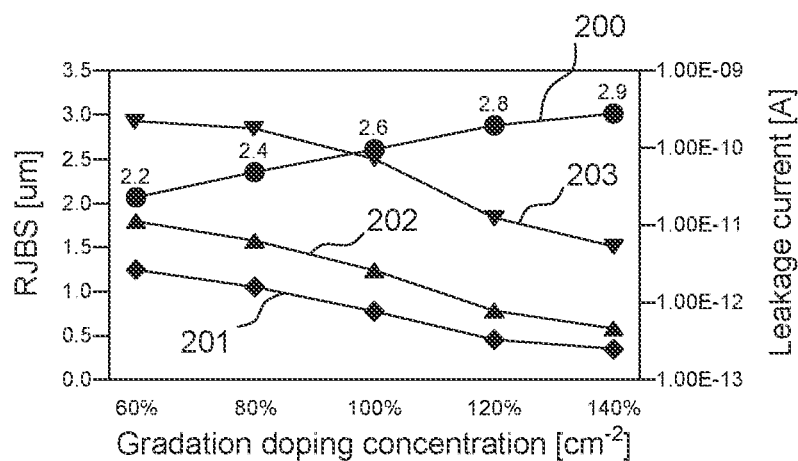
FIG. 16 and FIG. 17 are graphs exemplarily illustrating electrical characteristics according to the depth of the second conductivity-type junction region.
Figure 17:
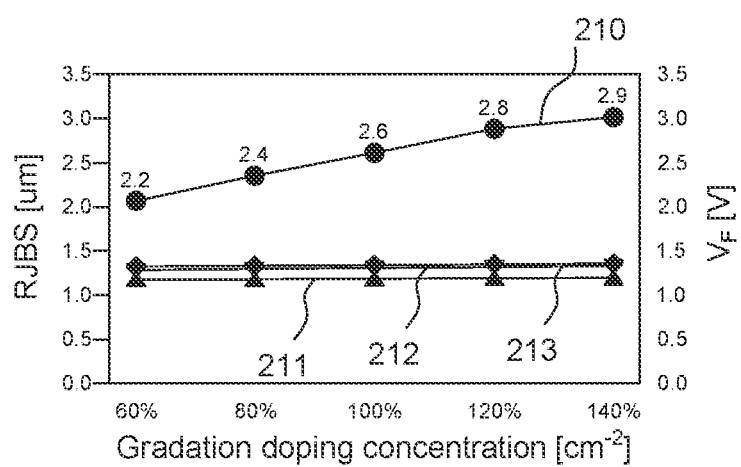

FIG. 16 and FIG. 17 are graphs exemplarily illustrating electrical characteristics according to the depth of the second conductivity-type junction region.

FIG. 16 shows measurements of leakage currents for each of five concentration profiles, with the depth of the charge injection region fixed at about 0.95 µm, while RJBS is changed to 2.2, 2.4, 2.6, 2.8, 2.9 µm and the depth of the second conductive junction region is changed to about 0.4, 0.6, and 0.8 µm. Leakage currents are measured when the reverse voltage $V_B$ is about −1,200 V. Graph 200 represents RJBS, graph 201 represents measurements of leakage current when the depth of the second conductivity-type junction region is about 0.4 µm, graph 202 represents measurements of leakage current when the depth of the second conductivity-type junction region is about 0.6 µm, and graph 203 represents measurements of the leakage current when the depth of the second conductivity-type junction region is about 0.8 µm. For example, when RJBS is 2.2 µm, the measured leakage current tends to decrease as the second conductivity-type junction region becomes deeper.

On the other hand, the leakage current tends to decrease as the doping concentration increases or the RJBS increases.

FIG. 17 shows measurements of the forward voltages $V_F$ for each of five concentration profiles, with the depth of the charge injection region fixed at about 0.95 µm, while RJBS is changed to 2.2, 2.4, 2.6, 2.8, 2.9 µm and the depth of the second conductive junction region is changed to about 0.4, 0.6, and 0.8 µm. The forward voltages $V_F$ are measured when the forward current $I_F$ is about 10 A. Graph 210 represents RJBS, graph 211 represents measurements of the forward voltage $V_F$ when the depth of the second conductivity-type junction region is about 0.4 µm, graph 212 represents measurements of the forward voltage $V_F$ when the depth of the second conductivity-type junction region is about 0.6 µm, and graph 213 represents measurements of the forward voltage $V_F$ when the depth of the second conductivity-type junction region is about 0.8 µm. For example, when RJBS is about 2.2 µm, the measured forward voltage $V_F$ tends to increase as the second conductivity-type junction region becomes deeper. On the other hand, the forward voltage $V_F$ tends to increase as the doping concentration increases or RJBS increases.

The above description of the invention is exemplary, and those skilled in the art can understand that the invention can be modified in other forms without changing the technical concept or the essential feature of the invention. Therefore, it should be understood that the above-mentioned embodiments are exemplary in all respects but are not definitive.

The scope of the invention is defined by the appended claims, not by the above detailed description, and it should be construed that all changes or modifications derived from the meanings and scope of the claims and equivalent concepts thereof are included in the scope of the invention.

What is claimed is:

1. A unit cell constituting an active area of silicon carbide junction barrier Schottky diode, comprising:
   a first conductivity-type substrate;
   a first conductivity-type epitaxial layer, being formed by epitaxial growth of silicon carbide doped with a first conductivity-type impurity on the first conductivity-type substrate;
   a charge injection region, being defined by a second conductivity-type junction region that is formed by ion implantation of a second conductivity-type impurity into a first conductivity-type charge injection layer that is formed by epitaxial growth of silicon carbide doped at a concentration of the first conductivity-type impurity higher than that of the first conductivity-type epitaxial layer on the first conductivity-type epitaxial layer;

a Schottky metal layer, being formed on the charge injection region and the second conductivity-type junction region;

an anode electrode, being formed on the Schottky metal layer; and a cathode electrode, being formed under the first conductivity-type substrate;

wherein the first conductivity-type charge injection layer comprises two or more multi-epitaxial layers having different first conductivity-type impurity concentrations;

wherein the first conductivity-type impurity concentrations of the two or more multi-epitaxial layers according to a reference concentration profile decrease in a direction toward the first conductivity-type epitaxial layer.

2. The unit cell according to claim 1, wherein an area occupied by the second conductivity-type junction region in the unit cell is in a range between 62% and 82%.

3. The unit cell according to claim 1, wherein the reference concentration profile defines the first conductivity-type impurity concentrations of the two or more multi-epitaxial layers.

4. The unit cell according to claim 3, wherein the reference concentration profile decreases the impurity concentration by 20% in the direction toward the first conductivity-type epitaxial layer.

5. The unit cell according to claim 3, wherein the first conductivity-type impurity concentrations of each of the two or more multi-epitaxial layers are equally increased by a maximum of 40% or a decrease of a minimum of −40% in the reference concentration profile.

6. The unit cell according to claim 1, wherein the depths of two or more multi-epitaxial layers decrease in the direction toward the first conductivity-type epitaxial layer.

7. The unit cell according to claim 1, wherein a depth of the second conductivity-type junction region is in a range between 60% and 100% of a depth of the charge injection region.

8. A silicon carbide junction barrier Schottky diode having an active area, comprising:

a first conductivity-type substrate;

a first conductivity-type epitaxial layer, being formed by epitaxial growth of silicon carbide doped with a first conductivity-type impurity on the first conductivity-type substrate;

a charge injection region, being formed on the first conductivity-type epitaxial layer and doped at a concentration of the first conductivity-type impurity higher than that of the first conductivity-type epitaxial layer;

a second conductivity-type junction region, being formed on the first conductivity-type epitaxial layer so as to contact the charge injection region;

a Schottky metal layer, being formed on the charge injection region and the second conductivity-type junction region;

an anode electrode, being formed on the Schottky metal layer; and a cathode electrode, being formed under the first conductivity-type substrate;

wherein the first conductivity-type charge injection layer comprises two or more multi-epitaxial layers having different first conductivity-type impurity concentrations;

wherein the first conductivity-type impurity concentrations of the two or more multi-epitaxial layers according to a reference concentration profile decrease in a direction toward the first conductivity-type epitaxial layer.

9. The silicon carbide junction barrier Schottky diode according to claim 8, wherein an area occupied by the second conductivity-type junction region in the active area is in a range between 62% and 82%.

10. The silicon carbide junction barrier Schottky diode according to claim 8, wherein the reference concentration profile defines the first conductivity-type impurity concentrations of the two or more multi-epitaxial layers.

11. The silicon carbide junction barrier Schottky diode according to claim 8, wherein the depths of two or more multi-epitaxial layers decrease in the direction toward the first conductivity-type epitaxial layer.

12. The silicon carbide junction barrier Schottky diode according to claim 8, wherein a depth of the second conductivity-type junction region is in a range between 60% and 100% of a depth of the charge injection region.

* * * * *